(12) United States Patent
Heismann et al.

(10) Patent No.: US 9,645,216 B2
(45) Date of Patent: May 9, 2017

(54) DETERMINATION OF A MEASURING SEQUENCE FOR A MAGNETIC RESONANCE SYSTEM

(71) Applicants: Björn Heismann, Erlangen (DE); Mathias Nittka, Baiersdorf (DE); Peter Speier, Erlangen (DE); Aurélien Stalder, Nürnberg (DE)

(72) Inventors: Björn Heismann, Erlangen (DE); Mathias Nittka, Baiersdorf (DE); Peter Speier, Erlangen (DE); Aurélien Stalder, Nürnberg (DE)

(73) Assignee: Siemens Aktiengesellschaft, München (DE)

(*) Notice: Subject to any disclaimer, the term of this patent is extended or adjusted under 35 U.S.C. 154(b) by 1135 days.

(21) Appl. No.: 13/757,446

(22) Filed: Feb. 1, 2013

(65) Prior Publication Data
US 2013/0200893 A1    Aug. 8, 2013

(30) Foreign Application Priority Data

Feb. 3, 2012  (DE) .................. 10 2012 201 630
Mar. 6, 2012  (DE) .................. 10 2012 203 512

(51) Int. Cl.
*G01V 3/00*     (2006.01)
*G01R 33/54*    (2006.01)
(Continued)

(52) U.S. Cl.
CPC .......... *G01R 33/543* (2013.01); *G01R 33/38* (2013.01); *G01R 33/3854* (2013.01); *G01R 33/56518* (2013.01)

(58) Field of Classification Search
CPC ................................................. G01R 33/543
(Continued)

(56) References Cited

U.S. PATENT DOCUMENTS 6,198,282 B1 * 3/2001 Dumoulin .......... G01R 33/3852
                                                     324/307
6,452,391 B1   9/2002 Bernstein et al.
(Continued)

FOREIGN PATENT DOCUMENTS

JP     2006 334 050     12/2006

OTHER PUBLICATIONS

German Office Action dated Dec. 19, 2012 for corresponding German Patent Application No. DE 10 2012 201 630.9 with English translation.
(Continued)

*Primary Examiner* — Louis Arana
(74) *Attorney, Agent, or Firm* — Lempia Summerfield Katz LLC (57) ABSTRACT

A method and a measuring-sequence-determining device for determining a measuring sequence for a magnetic resonance system based on at least one intra-repetition-interval time parameter are provided. During the determination of the measuring sequence in a gradient-optimization method, gradient-pulse parameters of the measuring sequence are automatically optimized to reduce at least one gradient-pulse-parameter maximum value. As a boundary condition in the gradient-optimization method, the intra-repetition-interval time parameter is kept constant at least within a specified tolerance value.

20 Claims, 4 Drawing Sheets

(51) Int. Cl.
*G01R 33/38* (2006.01)
*G01R 33/385* (2006.01)
*G01R 33/565* (2006.01)

(58) Field of Classification Search
USPC .................. 324/314, 307, 309, 318, 322
See application file for complete search history.

(56) References Cited

U.S. PATENT DOCUMENTS

| | | |
|---|---|---|
| 7,061,240 B2 | 6/2006 | Ham et al. |
| 7,301,341 B2* | 11/2007 | Hargreaves .......... G01R 33/561 324/307 |
| 2010/0308829 A1 | 12/2010 | Vu et al. |
| 2015/0204959 A1* | 7/2015 | Grodzki ............... G01R 33/543 324/314 |
| 2015/0212179 A1* | 7/2015 | Overall ................ G01R 33/543 324/309 |

OTHER PUBLICATIONS

M. Segbers, et al., "Optimized MRI Gradient Waveforms for Acoustic Noise Reduction," Proc. Intl. Soc. Mag. Reson. Med., vol. 16, pp. 1349 (2008).

P. Latta, et al., "Single Point Imaging with Suppressed Sound Pressure Levels through Radient-Shape Adjustment," Journal of Magnetic Resonance, vol. 170, pp. 177-183 (2004).

J. de Zwart, et al., "Reduction of Gradient Acoustic Noise in MRI Using SENSE-EPI," NeuroImage, vol. 16, pp. 1151-1155 (2002).

* cited by examiner

DETERMINATION OF A MEASURING SEQUENCE FOR A MAGNETIC RESONANCE SYSTEM

This application claims the benefit of DE 10 2012 201 630.9, filed on Feb. 3, 2012, which is hereby incorporated by reference. This application also claims the benefit of DE 10 2012 203 512.5, filed on Mar. 6, 2012, which is hereby incorporated by reference.

BACKGROUND

The present embodiments relate to determining a measuring sequence for a magnetic resonance system based on at least one intra-repetition-interval time parameter.

In a magnetic resonance system, the body to be examined may be exposed to a relatively high basic magnetic field of 3 or 7 tesla, for example, with the aid of a basic field magnetic system. A magnetic field gradient is also applied with the aid of a gradient system. High-frequency excitation signals (HF signals) are emitted by suitable antenna devices via a high-frequency transmission system, which is intended to cause the nuclear spins of specific atoms that have been excited in a resonant manner by this high-frequency field to be tilted by a defined flip angle relative to the magnetic field lines of the basic magnetic field. This high-frequency excitation and/or the resulting flip angle distribution are also referred to below as nuclear magnetization or "magnetization." During relaxation of the nuclear spins, high-frequency signals (e.g., magnetic resonance signals) are emitted, received by suitable receiver antennas and then processed further. The desired image data may be reconstructed from the raw data acquired in this way.

As explained above, for a specific measurement, a specific measuring sequence including a sequence of high-frequency pulses (e.g., excitation pulses, refocusing pulses and gradient pulses for transmission in a suitably coordinated manner in different spatial directions and suitably adapted readout windows, during which the induced magnetic resonance signals are acquired) is emitted. A factor for the imaging is the timing within the sequence (e.g., which pulses follow each other in which time intervals). A plurality of control parameters may be defined in a measuring protocol that is compiled in advance and may be called up for a specific measurement from a memory, for example, and optionally changed by the operator, who is able to specify additional control parameters such as, for example, a specific slice gap in a stack of slices to be measured, a slice thickness, etc. All these control parameters are used as the basis for the calculation of a measuring sequence.

Therefore, during a measuring sequence of this kind, the magnetic gradient coils are frequently switched over. Both the maximum amplitude of the gradient pulses and the rise time of the gradient current (e.g., the rise in the edges of the gradient pulses, termed the "slew rate") are important gradient-pulse parameters that affect the efficiency of a magnetic resonance tomography device. For example, numerous imaging sequences use high slew rates and high gradient-pulse amplitudes. However, the induction of eddy currents by the gradient pulses into surrounding metallic surfaces (e.g., the high-frequency screen of the magnetic resonance tomography device or even into the body of a patient or test subject) is unfavorably linked to the slew rate. For example, the higher the slew rate, the higher the eddy currents. The eddy currents in the body of the patient or test subject may result in artifacts and to peripheral nerve stimulation (PNS). Eddy currents with other components of the magnetic resonance tomography device (e.g., the high-frequency screen) are one reason for the known noise phenomena during the gradient switching. Similarly, noise development is intensified by higher gradient amplitudes since these also result in higher forces within the magnetic resonance tomography device. A higher slew rate and higher gradient amplitudes also result in higher energy consumption and place higher requirements on the hardware.

For example, to reduce noise emissions, there have already been various proposals with respect to the design of the hardware such as, for example, encapsulation or vacuum sealing of the gradient coils. Another possibility includes providing, as early as the calculation of the measuring sequences, that the slew rate and the gradient amplitude are limited to the greatest degree possible. Devices are thus found offering different "gradient modes." The operator may choose between a normal mode and a particularly quiet gradient mode, for example. In the quiet gradient mode, a maximum permissible slew rate for the gradient pulses is set to a lower value, which results in the measurement being quieter than in the normal mode. However, unfavorably, this may not only result in a longer measuring time overall, but also causes a reduction in the image quality (e.g., the contrast and/or the resolution). Hence, a limitation of the global maximum slew rate of this kind entails striking a compromise between the reduction in the sound level, the measuring time and the image quality.

SUMMARY AND DESCRIPTION

The present embodiments may obviate one or more of the drawbacks or limitations in the related art. For example, a suitable method and a corresponding measuring-sequence-determining device for determining measuring sequences based on specified control parameters, which result in minimized eddy currents and, without loss of image quality, are quiet and result in a minimized peripheral nerve stimulation (PNS), may be provided.

With the method, a plurality of control parameters (e.g., slice gaps, slice thicknesses, number and position of the slices) is specified for the measuring sequence. A large part of these parameters may be modified by the operator. For the calculation of a measuring sequence, the target magnetization to be achieved and a k-space gradient trajectory, along which the k-space is to be traversed during the data acquisition, may also be specified. The target magnetization and the k-space gradient trajectory may be derived from the protocol and may be changed by the operator not directly, but indirectly by the modification of other parameters, which result in another target magnetization or another k-space gradient trajectory. The automatic determination of the measuring sequence is performed with the aid of a sequence calculator, to which the control parameters, and further boundary conditions (e.g., a global (valid for all gradient pulses) maximum slew rate, a global maximum gradient amplitude, maximum high-frequency pulse amplitudes are specified.

However, these control parameters also include one or more intra-repetition-interval time parameters relevant to image quality. Here, "intra-repetition-interval time parameters" are time parameters that establish the timing within the repetition interval (e.g., with an echo sequence, the echo time TE that has a particular impact on the quality of the image and/or with a spin-echo sequence, the "echo spacing" ESP that indicates the time interval of the magnetic resonance signals to be acquired within a repetition interval). As explained above, these time parameters are also specified by a measuring protocol and optionally changed or re-input by the user. The present embodiments are not restricted to the above-named sequence types but are also applicable to the intra-repetition-interval time parameters with any other sequences (e.g., inversion-recovery sequences IR and gradient-echo sequences (GRE)).

In one embodiment, during the determination of the measuring sequence, in a gradient-optimization method, gradient-pulse parameters of the gradient pulse sequence of the measuring sequence are automatically optimized to reduce at least one gradient-pulse-parameter maximum value. As a further boundary condition in the gradient-optimization method, at least one intra-repetition-interval time parameter is kept constant within a specified tolerance value.

The gradient-pulse parameters may be the slew rate and/or the gradient amplitude of the gradient pulses. If these gradient-pulse parameters are optimized with respect to a reduction of at least one gradient-pulse-parameter maximum value, this results in a reduction of eddy currents both in the surrounding metallic parts (e.g., the HF screen of the magnetic resonance tomography devices) and in the patient and, hence, automatically to a lower noise level. In addition, the energy consumption is reduced. The reduction of the eddy currents in the patient also reduces the PNS. Since, however, simultaneously, the intra-sequence time parameters relevant for quality are kept constant to a large extent, this does not result in any loss of image quality, which then is to be compensated in another way or tolerated.

In an optimization method, as a boundary condition, an internal sequence time parameter that would result in a change in the image quality may be kept constant. Despite this provision, a significant reduction in noise and PNS with a plurality of usual measuring sequences may be achieved using the optimization method without any visible changes in the image quality. For example, a spin-echo sequence determined with the method has a noise reduction of up to 10 dBA compared to a spin-echo sequence determined with a conventional method.

One embodiment of a measuring-sequence-determining device for determining a measuring sequence for a magnetic resonance system includes an input interface for acquiring at least one intra-repetition-interval time parameter as one of the control parameters. For example, this input interface has a connection to the user interface, via which a user may input the time parameter or even a pure software interface in order to accept the time parameter (e.g., together with other control parameters) from a protocol. The measuring-sequence-determining device also includes a measuring-sequence-calculating unit embodied such that the measuring-sequence-determining device determines (e.g., calculates optimally) a measuring sequence on the basis of the control parameters. In one embodiment, the measuring-sequence-determining device is embodied such that, during the determination of the measuring sequence, which is performed in each case by the measuring-sequence-calculating unit in a gradient-optimization method, the measuring-sequence-determining device automatically optimizes gradient-pulse parameters of the measuring sequence to reduce at least one gradient-pulse-parameter maximum value. As a boundary condition in the gradient-optimization method, the intra-repetition-interval time parameter is kept constant, at least within the specified tolerance value.

The measuring-sequence-determining device also has a measuring-sequence output interface in order to output the measuring sequence to further devices. The further devices prompt the magnetic resonance tomography device to output the high-frequency pulses and gradient pulses according to the measuring sequence and to receive and further process the magnetic resonance signals.

In one embodiment of a method for operating a magnetic resonance system, according to the above-described method, a measuring sequence is determined, and the magnetic resonance system is operated using this measuring sequence. In one embodiment, for a complete measurement, for example, for measuring a complete slice or a stack of slices covering a specified region of interest (ROI), a sequence of several measuring sequences is processed. Accordingly, one embodiment of a magnetic resonance system includes an above-described measuring-sequence-determining device.

Parts of the measuring-sequence-determining device may be embodied in the form of software components or hardware components (e.g., processors). This, for example, relates to the measuring-sequence-determining unit and optionally also to a special gradient-optimizing unit. The input interface may, for example, be a user interface for the manual input of the control parameters (e.g., also a graphical user interface). This can also include an interface enabling data to be selected and accepted from a data memory arranged within the measuring-sequence-determining device or connected therewith via a network (optionally, also using the user interface). The measuring-sequence output interface may also be, for example, an interface that forwards the measuring sequence to a magnetic resonance control in order to control the measurement directly or also an interface that transmits the data via a network and/or stores the data in a memory for later use. These interfaces may also be embodied, at least partially, in the form of software and/or hardware interfaces of an available computer.

In one embodiment, a computer program that may be loaded directly into a memory of a measuring-sequence-determining device includes program code segments in order to carry out all acts of the method when the program is executed in the measuring-sequence-determining device. A software implementation of this kind has the advantage that even previous devices used for the determination of measuring sequences (e.g., suitable computers in computer centers of the manufacturer of the magnetic resonance system) may be modified in a suitable way by the implementation of the program in order to determine measuring sequences associated with a lower noise level and PNS in the way according to the an embodiment.

The description in one category may also be developed similarly to the dependent claims in another claim category.

As an intra-repetition-interval time parameter that is relevant to image quality (e.g., the echo time with an echo sequence or a spin-echo sequence), the echo spacing may also be kept constant during the gradient-optimization method. A further intra-repetition-interval time parameter relevant to image quality, which, as a boundary condition, is kept constant during the method, may be the inversion time TI during inversion-recovery sequences IR. In one embodiment, the actual repetition time (e.g., the length of the repetition interval) is also kept constant.

In one embodiment, it is sufficient, for a boundary condition, for the relevant time parameter or parameters to be kept constant within a tolerance value (e.g., a specific fluctuation range, in which modification of the time parameters is still permissible, may be specified). The tolerance parameter is advantageously selected such that the tolerance parameter does not result in any relevant impacts on the image quality. For example, when a time parameter may be varied by the operator on a user interface, the tolerance value is, for example, +/−the maximum half value of an input increment of the parameter at the user interface. If, for example, the operator is also able to input the echo time in steps of 1 ms, the tolerance value may be below +/−0.5 ms so that in the end, with the corresponding rounding-up or rounding-down, image data with the input echo time is generated.

In one embodiment, if a plurality of time parameters is kept constant, it is not necessary for all the tolerance values to be the same. For example, some intra-repetition-interval time parameters may be varied in a specified tolerance value, while other intra-repetition-interval time parameters are to be kept absolutely constant.

There are various possibilities for performing a measuring sequence with an optimized gradient pulse sequence with respect to the reduction of at least one gradient-pulse-parameter maximum value (and hence with respect to the reduction of eddy currents) while observing the additional boundary conditions of keeping the intra-repetition-interval time parameters constant.

An analytical calculation of the measuring sequence with the given boundary conditions is possible. The complex time dependence of the gradients for the entire measuring sequence is to be known in advance so that the gradient parameters for the individual pulses or gradient-pulse segments may be calculated in advance. An analytical calculation of this kind has the advantage that the analytical calculation may be carried out very quickly.

In one embodiment, the optimization of the gradient-pulse parameters in the gradient-optimization method is performed numerically. A numerical optimization has the advantage that the advance knowledge of the time dependencies is less (e.g., each individual gradient pulse may be optimized without knowledge of the other gradient pulses).

In one embodiment, in the gradient-optimization method, the optimization of the gradient-pulse parameter takes place by the direct optimization or reduction of the gradient-pulse-parameter maximum value, which is not to be exceeded by the gradient-pulse parameters to be optimized. The gradient-pulse-parameter maximum value is, for example, checked in a sequence-determining process (e.g., the measuring-sequence-calculating unit is specified) to see whether, while observing the boundary conditions of keeping the intra-repetition-interval time parameter constant within the specified tolerance value, the specified gradient-pulse-parameter maximum value may be used to determine a suitable measuring sequence. Therefore, this method is used to determine an optimum gradient-pulse-parameter maximum value that may be specified to the sequence-determining process in addition to the intra-repetition-interval time parameters to be kept constant as a further boundary condition for the determination of the optimum measuring sequence.

In one embodiment, the gradient-optimization method includes an iteration method. Initially, a gradient-pulse-parameter maximum value is specified as a start value, and this gradient-pulse-parameter maximum value is reduced in a plurality of iterations with a defined increment. In each iteration, the current gradient-pulse-parameter maximum value is used to carry out a sequence-determining process for determining the measuring sequence while keeping the intra-repetition-interval time parameter constant within the specified tolerance value. On the successful determination of the measuring sequence, a new iteration is then performed in each case up to a specified abort criterion.

The iteration method may be aborted if, in an iteration with the current gradient-pulse-parameter maximum value, the successful determination of the measuring sequence while keeping the intra-repetition-interval time parameter constant within the specified tolerance value is no longer possible.

Following the abortion of the iteration method, a gradient-pulse-parameter maximum value that is above the last current gradient-pulse-parameter maximum value (e.g., the penultimate current gradient-pulse-parameter maximum value) is output as the optimum gradient-pulse-parameter maximum value. The gradient-pulse-parameter maximum value determined in this way may be used to calculate an optimized measuring sequence containing the desired time parameters. Other iterative algorithms may also be used.

The start value used for this iterative method may be a global gradient-pulse-parameter maximum value or a maximum slew rate or a maximum gradient amplitude that is applicable for all pulses and would, for example, be permitted by the magnetic resonance system and hardware options of the magnetic resonance system and safety specifications. This start value corresponds to the same gradient-pulse-parameter maximum value as that already specified for conventional methods.

This optimization may be used jointly for all gradient pulses of the measuring sequence.

In one embodiment, an individual gradient-pulse-parameter maximum value may be determined separately for an individual pulse segment. This may involve defined, functionally demarcated time intervals such as, for example, a specific ramp, a plateau, etc. of a gradient pulse. However, in this context, a pulse segment may also include only a part of a functionally demarcated time interval (e.g., a part of a ramp or a plateau). In extreme cases, the method may also be broken down into the smallest temporal pulse segments (e.g., individual optimization is performed for each instant of a gradient pulse that for each gradient axis may result in time-dependent optimization and not in linearly optimized pulses). Similarly, an individual gradient-pulse-parameter maximum value for an individual complete gradient pulse (e.g., an individual pulse) may be determined separately.

In one embodiment, the gradient-optimization method includes a plurality of intermediate optimizations. For example, each of the intermediate optimizations may include its own iteration method.

In one variant, for example, in each intermediate optimization, an individual gradient-pulse-parameter maximum value for a logical functional group of gradient pulses is determined separately in each case. This provides that, for example, within the context of the optimization method, in a plurality of optimization acts for individual logically functionally relating groups of gradient pulses, all spoiler pulses and/or all excitation and/or refocusing pulses, for example, undergo their own iteration method.

As a result, before the final compilation of the measuring sequence, a number of separate gradient-pulse-parameter maximum values for, depending upon the embodiment of the method, logically functional groups, individual gradient pulse and/or individual pulse segments are available. All these gradient-pulse-parameter maximum values are taken into account together with the intra-repetition-interval time parameters to be kept constant within a sequence-determining process as boundary conditions and the optimum measuring sequence determined. A conventional measuring-sequence-calculating unit, such as is already used for determining measuring sequences, may be used.

The method may be used for the optimization of originally trapezoidal gradient pulses (e.g., before the performance of the optimization method). Therefore, the measuring sequence initially specifies trapezoidal "start-gradient pulses," the gradient-pulse parameters of which are then automatically optimized within the gradient-optimization in order to arrive at the optimized gradient pulses in the measuring sequence.

Therefore, overall, the method has a plurality of advantages. The artifacts formed by eddy currents may be minimized. Simultaneously, the method results in reduced PNS of the patient and to lower noise levels. In addition, the energy consumption may be reduced by the gradient pulse amplifiers. Simultaneously, it is provided that there are no negative effects on the image contrast or other image quality features so that the method is suitable for clinical use. A further advantage is that no special user interfaces have to be used for the adjustment.

DETAILED DESCRIPTION OF THE DRAWINGS

Figure 1:
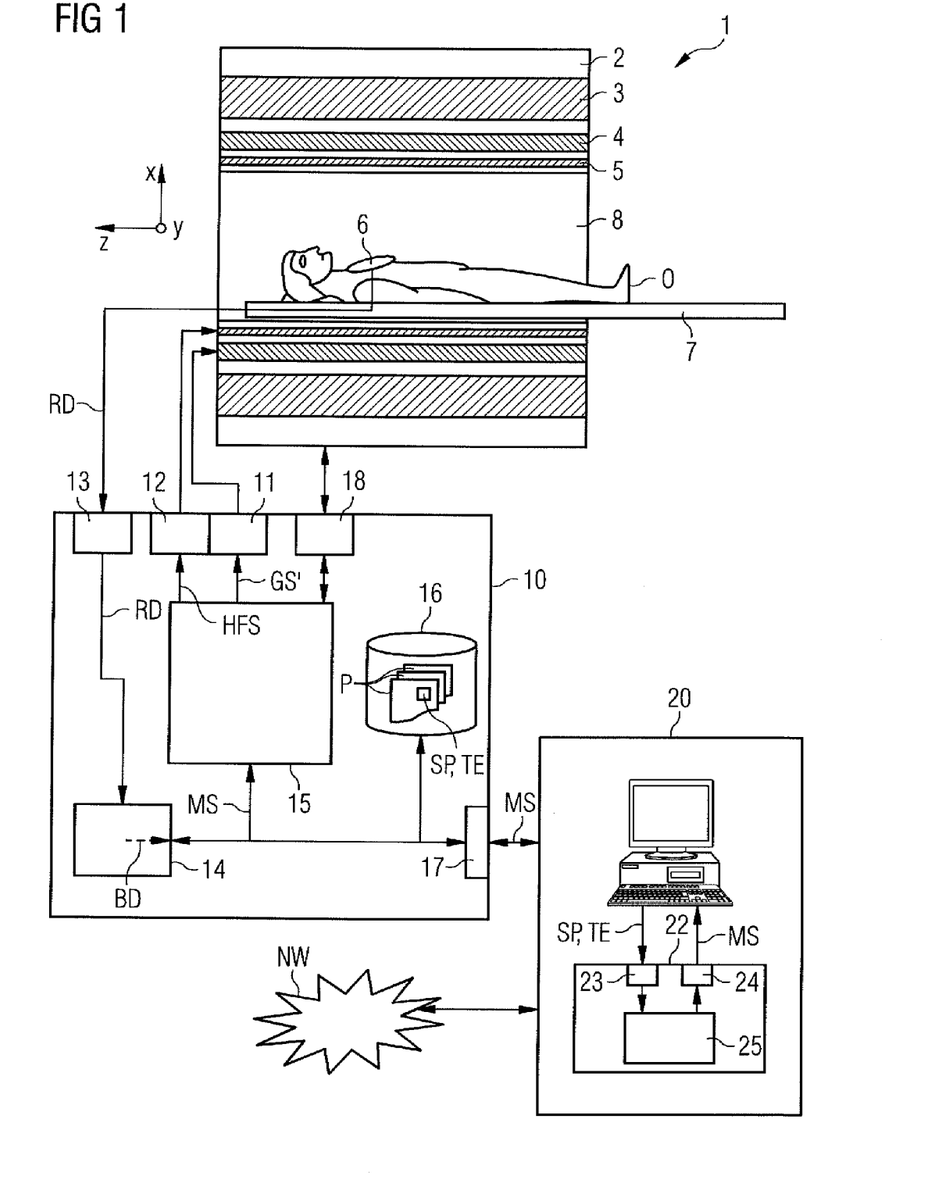
FIG. 1 shows a schematic representation of an exemplary embodiment of a magnetic resonance system.

FIG. 1 shows a schematic representation of one embodiment of a magnetic resonance system 1. The magnetic resonance system 1 includes a magnetic resonance scanner 2, within which there is an examination chamber or patient tunnel 8. A table 7 may be moved into the patient tunnel 8 so that a patient O or test subject lying on the table 7 may be placed at a specific position within the magnetic resonance scanner 2 during an examination relative to the magnetic system and high-frequency system arranged therein or may also be moved between different positions during a measurement.

The magnetic resonance scanner 2 includes a basic field magnet 3, a gradient system 4 with magnetic field gradient coils to generate magnetic field gradients in the x-, y- and z-directions, and a whole-body high-frequency coil 5. The magnetic field gradient coils in the x-, y- and z-directions may be controlled independently of each other so that, using a specified combination, gradients may be applied in any logical spatial direction (e.g., in the slice-selection direction, in the phase-encoding direction or in the readout direction). The slice-selection direction, the phase-encoding direction, and the readout direction are dependent upon the selected slice orientation. The magnetic resonance signals induced in the examination object O may be received by the whole-body coil 5, with which the high-frequency signals may also be emitted to induce the magnetic resonance signals. In one embodiment, the high-frequency signals are received by a local-coil arrangement 6 with, for example, local coils (of which, only one is shown in FIG. 1) placed on or under the patient O. All these components are known in principle to the person skilled in the art and are therefore only depicted in a very simplified manner in FIG. 1.

The components of the magnetic resonance scanner 2 may be controlled by a control device 10. The control device 10 may be a control computer that may also include a plurality of individual computers. The computers may be spatially separate and connected to each other via suitable cables or the like. A terminal interface 17 connects the control device 10 to a terminal 20, via which an operator may control the entire system 1. In this case, the terminal 20 is equipped as a computer with a keyboard, one or more screens and further input devices such as, for example, a mouse or the like, so that a graphical user interface is available to the operator.

The control device 10 includes, for example, a gradient control unit 11 that may include a plurality of subcomponents. The individual gradient coils are switched via the gradient control unit 11 according to a gradient pulse sequence GS with control signals. As described above, these are gradient pulses that are set during a measurement at specified temporal positions and with a specified temporal course.

The control device 10 also includes a high-frequency transmitter unit 12 in order to supply the whole-body high-frequency coil 5 with high-frequency pulses according to a specified high-frequency pulse sequence HFS of the measuring sequence MS. The reception of the magnetic resonance signals takes place with the aid of the local-coil arrangement 6, and the raw data RD received thereby are read out and processed by a HF receive unit 13. The magnetic resonance signals are transmitted in digital form as raw data RD to a reconstruction unit 14, which reconstructs the image data BD therefrom and stores the image data BD in a memory 16 and/or transfers the image data BD via the interface 17 to the terminal 20 so that the operator may view the image data BD. The image data BD may also be stored and/or displayed and evaluated via a network NW at other locations. Alternatively, a high-frequency pulse sequence may also be transmitted via the local-coil arrangement, and/or the magnetic resonance signals may be received by the whole-body high-frequency coil (not shown).

A further interface 18 is used to send control commands to other components of the magnetic resonance scanner 2 such as, for example, the table 7 or the basic field magnet 3, or to accept measured values or other information.

The gradient control unit 11, the HF transmitter unit 12 and the HF receive unit 13 are each controlled in a coordinated manner by a measurement control unit 15. This uses corresponding commands to provide that the desired gradient pulse sequences GS and high-frequency pulse sequences HFS are transmitted. The magnetic resonance signals are read out and processed further by the HF receive unit 13 at the local coils of the local-coil arrangement 6. The measurement control unit 15 also controls the interface 18.

However, the basic course of such a magnetic resonance measurement and the named control components are known to the person skilled in the art and so will not be discussed in any more detail here. A magnetic resonance scanner 2 of this kind and the associated control device may include a plurality of further components that are likewise not explained in detail here. The magnetic resonance scanner 2 may also have a different design, for example, with a side-opening patient chamber or may be a smaller scanner in which only one body part may be positioned.

To start a measurement, an operator may select a control protocol P intended for this measurement via the terminal from a memory 16 in which a plurality of control protocols P for different measurements is stored. This control protocol P includes, for example, different control parameters SP, TE for the respective measurement. These control parameters SP include specific basic specifications for the desired measuring sequence (e.g., whether the measuring sequence is a spin-echo sequence or a turbo-spin-echo sequence). The control parameters SP also include control parameters relating to the magnetizations to be achieved by the individual high-frequency pulses, specifications for a k-space gradient trajectory to be traversed to record raw data and also slice thicknesses, slice gaps and the number of slices. The control parameters SP may also include intra-repetition-interval time parameters. An echo time TE in a spin-echo sequence is provided as an example. This example is also used in the following explanations with reference to the other figures, since this is an important intra-repetition-interval time parameters relevant to image quality.

The operator may use the terminal 20 to change a part of these control parameters in order to create an individual control protocol for the currently desired measurement. The variable control parameters (e.g., intra-repetition-interval time parameters such as the echo time TE) are available on a graphical user interface of the terminal for amendment. For example, the operator may set the echo time TE in increments of 1 ms (e.g., in the case of small echo times of less than 10 ms, in an increment of 0.1 ms), which influences, for example, the measuring time of an examination and also the image quality (e.g., contrast and resolution). If the operator does not make any change, the echo time specified in the protocol is used. This may be a very good specification for the majority of cases, for which the respective sequence may be used.

Otherwise, the operator may also retrieve control protocols via a network NW, for example, from a manufacturer of the magnetic resonance system, and then optionally modify and use the control protocols.

Based on the control parameters SP including the selected intra-repetition-interval time parameters TE, a measuring sequence MS, with which the actual control of the other components by the measurement control unit 15 takes place, is determined.

This measuring sequence MS is calculated in a measuring-sequence-determining device 22 that is, for example, depicted as part of the terminal 20 and may, for example, be implemented in the form of software components on the computer of the terminal 20. However, the measuring-sequence-determining device 22 may also be part of the actual control device 10 (e.g., the measurement control unit 15). However, the measuring-sequence-determining device may also be implemented on a separate computer system that, for example, is connected via the network NW to the magnetic resonance system.

This measuring-sequence-determining device includes, for example, an input interface 23 to accept the control parameters SP (e.g., the intra-repetition-interval time parameters TE).

These control parameters SP, TE are forwarded to a measuring-sequence-calculating unit 25 that determines an optimum measuring sequence. The control parameters SP, TE may be output via a measuring-sequence interface 24 and, for example, in the case shown in FIG. 1, sent via the terminal interface 17 to the measurement control unit 15 so that the measurement is performed fully automatically. In one embodiment, more than one measuring sequence may be generated for a measurement. A sequence of such measuring sequences, which are processed one after the other in order to acquire the raw data RD used for the desired image data BD, may be generated.

Figure 2:
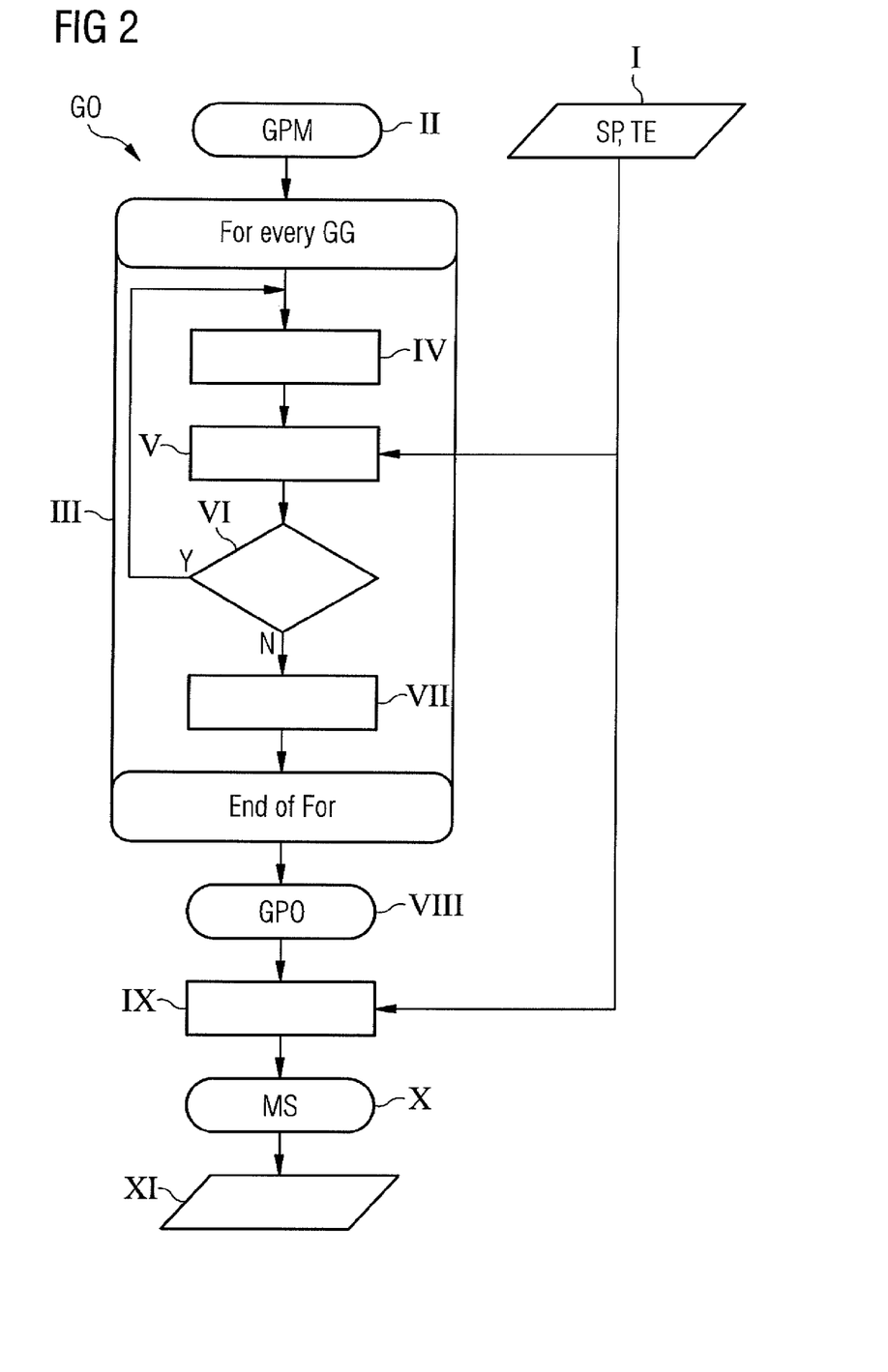
FIG. 2 shows a flow chart of an exemplary embodiment of a method for determining a measuring sequence.

FIG. 2 shows an exemplary sequence of a method for determining a measuring sequence.

The method starts with act I with the acceptance of the specified control parameters SP, TE. In act II, initially, a global gradient-parameter maximum value GPM that is not to be exceeded by any of the gradient pulses of the measuring sequence to be created is specified. For example, this may be a maximum slew rate and/or a maximum gradient amplitude allowed by the magnetic resonance system, taking hardware and safety-relevant specifications into consideration.

In act III, an iteration method is executed in order to specify a reduced, optimum gradient-pulse-parameter maximum value GPO that is, for example, a reduced maximum slew rate or a reduced maximum gradient amplitude for the determination of the optimized measuring sequence. Attention is paid to the fact that the intra-repetition-interval time parameters (e.g., the echo time TE) are kept constant at least within the specified tolerance value of, for example, +/−the maximum half value of the input increment of the relevant parameter at the user interface of the terminal.

In one embodiment, act III is optionally performed many times (e.g., for each logically functional group of gradient pulses, for each individual gradient pulse, for each specific segment or specific ramps of a gradient pulse, or in extreme cases, for each individual time point and each individual gradient axis separately). This multiple execution of act III is symbolized by the upper part with the statement "For every GG," which indicates the start of the outer execution loop of the act III and the lower segment with the statement "End of For," which indicates the end of the loop. In this exemplary embodiment, it is assumed that the gradient pulses are optimized in groups (e.g., different functionally related groups GG of gradient pulses are formed) that are, for example, output together in order to achieve a specific effect. In one embodiment, a logical gradient pulse group GG also includes gradient pulses on a plurality of axes, and both logical axes (e.g., slice-selection direction, phase-encoding direction and readout direction) and physical axes (e.g., x-, y-, z-directions). A specific example of this is explained below with reference to FIGS. 3 and 4. In one embodiment, a gradient pulse group GG may also include only one individual gradient pulse. Alternatively, the outer loop may also be executed for each individual gradient pulse or even for individual segments of gradient pulses (e.g., specific edges) separately. The result is, on each execution, an individually optimized, reduced gradient-parameter maximum value for the respective gradient pulse group GG, the respective gradient pulse or the segment of the gradient pulse, for which the outer loop has been executed.

Within this outer loop in act III, the iteration loop including acts IV, V and VI may be executed a plurality of times.

In act IV, initially, the current gradient-pulse-parameter maximum value GPM (e.g., on the first execution of the loop, the start value) may be reduced by a specific increment (e.g., by 1%).

In act V, a calculation of the complete measuring sequence is performed in a conventional measuring sequence-determining process (e.g., with a conventional sequence calculator; already used previously to calculate pulse sequences). The parameters SP, TE are input as specifications. As boundary conditions, the intra-repetition-interval time parameter TE is kept constant within the specified tolerance value, and the current gradient-pulse-parameter maximum value GPM for the respective gradient pulse of the gradient pulse group GG to be optimized during this execution of act III is not exceeded. In one embodiment, the optimized gradient-pulse-parameter maximum values already found in previous executions of act III are observed.

In act VI, which is shown separately from Step V but may be directly connected to this, the question is then clarified whether a sequence of this kind may actually be realized with the specified timing. If this is the case (e.g., Branch "y"), the method returns to act IV, and the current gradient-pulse-parameter maximum value is again reduced by an increment. In this way, the gradient-pulse-parameter maximum value GPM is repeatedly reduced. A check is performed each time to determine whether the specified gradient-pulse-parameter maximum value may still be used to determine a pulse sequence that observes the specified boundary conditions. If in act VI it is identified that this is no longer possible, the iteration method is aborted (e.g., Branch "n").

In act VII, the current gradient-pulse-parameter maximum value is increased again by exactly one increment so that, after the abortion of the iteration loop, the "optimum" gradient-pulse-parameter maximum value readopts the penultimate value, with which an acceptable measuring sequence may be calculated.

The iteration method is executed for each of the logical gradient-pulse groups GG so that in act VIII, an individual optimum gradient-pulse-parameter maximum value GPO is available for each of the individual groups GG.

This set of optimum gradient-pulse-parameter maximum values GPO is fed back to the sequence calculator in act IX, which, taking into consideration the specified control parameters (e.g., the boundary conditions) to keep intra-repetition-interval time parameters TE constant within the tolerance value and not to exceed the individual optimum gradient-pulse-parameter maximum value GPO, determines an optimum measuring sequence. The sequence calculator used in act IX for this is, for example, once again the sequence calculator used in act V.

In act X, the optimized measuring sequence MS is available and is output in act XI in the magnetic resonance scanner.

Figure 3:
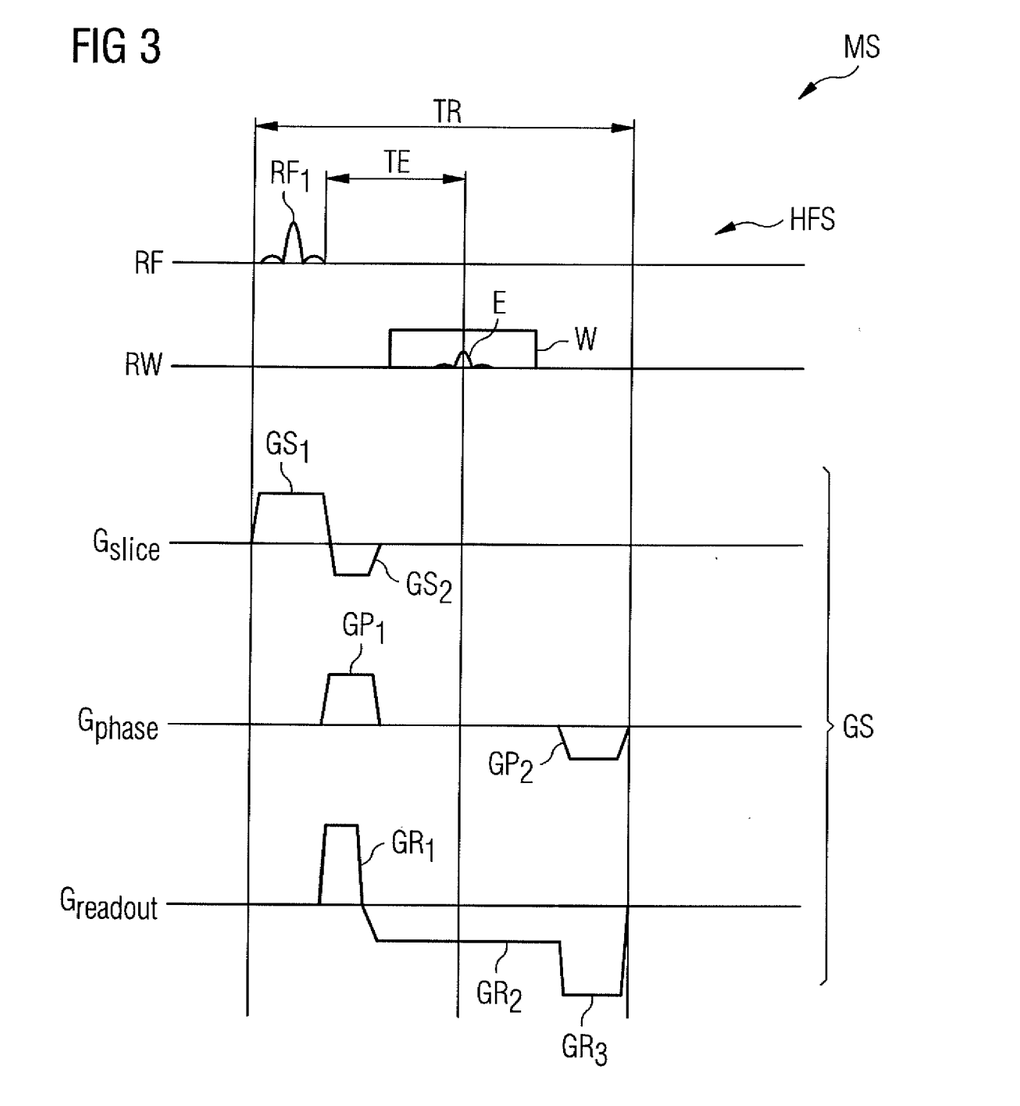
FIG. 3 shows a schematic pulse diagram showing an exemplary repetition interval of a gradient-echo-measuring sequence prior to optimization.
Figure 4:
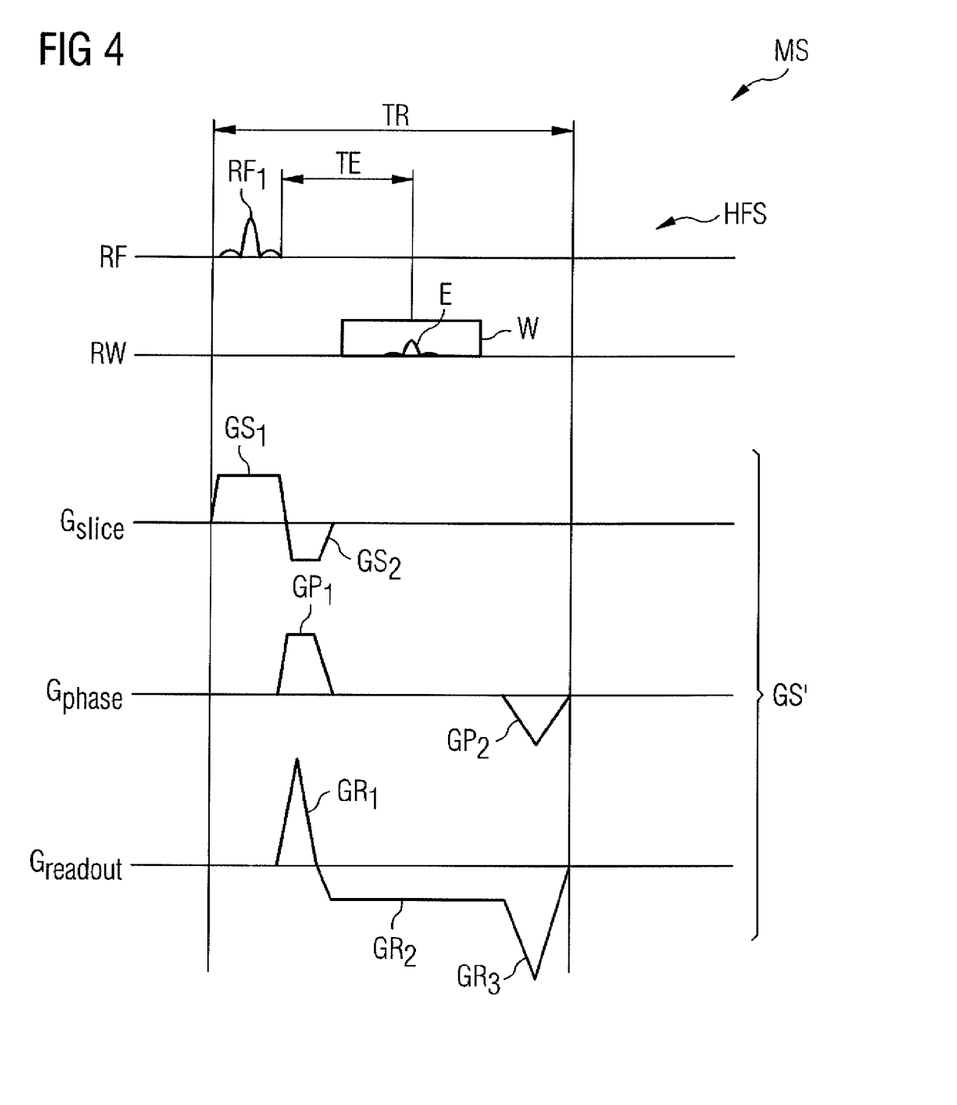
FIG. 4 shows the pulse diagram according to FIG. 3 after an exemplary optimization of gradient-pulse parameters.

FIGS. 3 and 4 show a schematic exemplary embodiment of a modification of a gradient echo sequence using the method according to an embodiment. FIG. 3 shows a repetition interval of a gradient echo sequence, as calculated, without using the method, and FIG. 4 shows the optimized gradient echo sequence determined using the method.

Both FIG. 3 and FIG. 4 show the high-frequency pulse $HF_1$ of the high-frequency pulse sequence HFS on the upper time axis RF. The underlying time axis RW depicts a readout window W, in which the expected echo signal E is read out. The measuring sequence MS shown is a very simple sequence with only one excitation pulse $RF_1$ and a subsequent echo signal E.

The three lowest time axes depict the gradient pulse sequence GS. The uppermost of these three time axes $G_{slice}$ depicts the gradients $GS_1$, $GS_2$ in the slice-selection-gradient direction, the middle time axis $G_{phase}$ depicts the gradient pulse GP1, GP2 in the phase-encoding-gradient direction, and the bottommost time axis $G_{readout}$ depicts the gradient pulses $GR_1$, $GR_2$, $GR_3$ in the readout-gradient direction. On each time axis, the voltage is shown over time in arbitrary units.

The gradient echo sequence GS initially starts with the transmission of a slice-selection-gradient pulse $GS_1$ in the slice-selection-gradient direction, which is sent simultaneously with a slice-selective excitation-high-frequency pulse $HF_1$. This excites a specific slice. This is followed by a negative rephasing pulse $GS_2$ in the slice-selection-gradient direction, a phase-encoding-gradient pulse $GP_1$ in the phase-encoding-gradient direction and a rephasing pulse $GR_1$ in the readout gradient direction. In the readout gradient direction, this is followed by a longer readout gradient pulse $GR_2$ during the readout window W. The gradient sequence is terminated after the end of the readout window W with a negative spoiler pulse $GP_2$ in the phase-encoding-gradient direction and a simultaneously transmitted negative spoiler pulse $GR_3$ in the readout gradient direction. FIG. 3 depicts the echo time TE from the maximum of the transmitted excitation-high-frequency pulse $HF_1$ to the maximum of the echo signal E as an intra-repetition-interval time parameter relevant to image quality. As shown in FIG. 3, all gradient pulses are initially created in trapezoidal shape.

As a comparison of FIGS. 4 and 3 shows, for the optimization, nothing is changed in either the high-frequency pulse sequence HFS or with respect to the readout window W. For example, the intra-repetition-interval timing (e.g., the echo time TE) is kept just as constant as the entire internal repetition time TR. However, with some gradient pulses (e.g., the gradient pulse sequence GS'), the slew rate and the amplitude are modified.

The global slew rate for all pulses is reduced. After this, the slew rate is optimized individually for each gradient pulse $GS_1$, $GS_2$, $GP_1$, $GP_2$, $GR_1$, $GR_2$, $GR_3$.

For some of the gradient pulses, there are only minimal, but still non-negligible changes. For example, with the negative rephasing pulse $GS_2$, in the slice-selection-gradient direction and the phase-encoding-gradient pulse $GP_1$, the trapezoidal shape is retained but the slew rate and, in reciprocity, the amplitude increased. The rephasing pulse $GR_1$ in the readout gradient direction and the two spoilers $GP_2$, $GR_3$ in the phase-encoding-gradient direction and in the readout gradient direction have experienced drastic changes. In the case of each of these three pulses $GR_1$, $GP_2$, $GR_3$, the slew rate is significantly reduced, so that in the optimized gradient pulse sequence GS', an approximately triangular pulse is present. The change to each of the gradient pulse takes place such that the integral of the pulses (e.g., the area circumscribed by the pulse shape; the gradient moment) remains unchanged. Since the slew rate is reduced (e.g., once again), the amplitude was partially increased, although the advantage obtained with respect to the noise level and the PNS by the reduction of the slew rate is not nullified. Alternatively, the pulses may also be extended as long as this does not affect the echo time to be kept constant.

The exemplary sequence shown in the figures also makes clear the advantage compared to the simple use of exclusively triangular gradient shapes. For example, a pure transformation of all gradient pulses in triangular gradient shapes may also change the intra-repetition-interval timing. In addition, with certain pulses (e.g., the rephasing pulse $GS_2$ in the slice-selection-gradient direction and the phase-encoding-gradient pulse $GP_1$), there may be a risk that the global maximal permissible gradient amplitude may be achieved. Within the context of the method, such restrictions may be maintained without problems.

In one embodiment, all changes to the gradient pulses take place such that the parameters relevant to imaging (e.g., echo time TE, repetition time IR, amplitudes of the slice-selection gradient $GS_1$ and of the readout gradient $GR_2$) remain uninfluenced. This has the overall result that the images generated with these sequences are identical (e.g., it is irrelevant for the image quality whether the raw data was generated with a sequence of measuring sequences according to FIG. 3 or with a sequence of measuring sequences according to FIG. 4). However, the measuring sequences according to FIG. 4 overall result in a significantly lower slew rate and/or gradient amplitude over the duration of the sequence and hence to reduce eddy currents, are significantly quieter and result in reduced PNS. In specific test measurements, this enables the noise level to be reduced by about 8.5 dBA without any impairment to the image quality.

The detailed methods and installations described above are exemplary embodiments, and the basic principle may be varied in wide ranges by the person skilled in the art without leaving the scope of the invention as specified in the claims. For example, the method according to the invention may be used not only with spin-echo methods, turbo-spin-echo sequences and gradient-echo sequences but may also be used with virtually all other sequences desired. For purposes of completeness, reference is also made to the fact that the use of the indefinite article "a" or "an" does not preclude the possibility that the features in question may also be present on a multiple basis. Similarly, the term "unit" does not preclude the possibility that the unit includes a plurality of components that may also be spatially distributed.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a measuring sequence for a magnetic resonance system based on at least one intra-repetition-interval time parameter, the method comprising:
automatically optimizing, during the determination of the measuring sequence in a gradient-optimization method, gradient-pulse parameters of the measuring sequence in order to reduce at least one gradient-pulse-parameter maximum value,
wherein, as a boundary condition in the gradient-optimization method, the intra-repetition-interval time parameter is kept constant at least within a specified tolerance value.

2. The method as claimed in claim 1, wherein the gradient-pulse parameters comprise a slew rate, a gradient amplitude of a gradient pulse of the measuring sequence, or the slew rate and the gradient amplitude.

3. The method as claimed in claim 1, wherein the measuring sequence comprises an echo sequence, and the intra-repetition-interval time parameter comprises an echo time.

4. The method as claimed in claim 1, further comprising optimizing, in the gradient-optimization method, the at least one gradient-pulse-parameter maximum value.

5. The method as claimed in claim 4, further comprising checking, in the gradient-optimization method, the at least one gradient-pulse-parameter maximum value in a sequence-determining process, to see whether, while observing the boundary condition of keeping the intra-repetition-interval time parameter constant within the specified tolerance value, the specified gradient-pulse-parameter maximum value is usable to determine the measuring sequence.

6. The method as claimed in claim 4, wherein the gradient-optimization method comprises an iteration method, the iteration method comprising:
initially specifying a gradient-pulse-parameter maximum value as a start value;
reducing the gradient-pulse-parameter maximum value in a plurality of iteration steps with a defined increment;
performing, in each iteration step of the plurality of iteration steps with the current gradient-pulse-parameter maximum value, a sequence-determining process for determining the measuring sequence while keeping the intra-repetition-interval time parameter constant within the specified tolerance value; and
performing, on the successful determination of the measuring sequence, a new iteration step up to a specified abort criterion.

7. The method as claimed in claim 6, further comprising aborting the iteration method when, in an iteration step with the current gradient-pulse-parameter maximum value, no successful determination of the measuring sequence is possible while keeping the intra-repetition-interval time parameter constant within the specified tolerance value.

8. The method as claimed in claim 7, further comprising outputting, following the abortion of the iteration method, a gradient-pulse-parameter maximum value that is above the last current gradient-pulse-parameter maximum value as the at least one optimum gradient-pulse-parameter maximum value.

9. The method as claimed in claim 8, wherein the last current gradient-pulse-parameter maximum value is a penultimate current gradient-pulse-parameter maximum value.

10. The method as claimed in claim 4, further comprising specifying a global gradient-pulse-parameter maximum value as the start value.

11. The method as claimed in claim 1, further comprising determining an individual gradient-pulse-parameter maximum value separately for an individual pulse segment of a gradient pulse.

12. The method as claimed in claim 1, further comprising determining an individual gradient-pulse-parameter maximum value separately for an individual complete gradient pulse.

13. The method as claimed in claim 1, further comprising determining an individual gradient-pulse-parameter maximum value separately for a functional group of gradient pulses.

14. A method for operating a magnetic resonance system, the method comprising:
determining a measuring sequence for the magnetic resonance system based on at least one intra-repetition-interval time parameter, the determining comprising automatically optimizing, during the determination of the measuring sequence in a gradient-optimization method, gradient-pulse parameters of the measuring sequence in order to reduce at least one gradient-pulse-parameter maximum value, wherein, as a boundary condition in the gradient-optimization method, the intra-repetition-interval time parameter is kept constant at least within a specified tolerance value; and
operating the magnetic resonance system using the determined measuring sequence.

15. A measuring-sequence-determining device for determining a measuring sequence for a magnetic resonance system, the measuring-sequence-determining device comprising:
an input interface operable to acquire at least one intra-repetition-interval time parameter; and
a measuring-sequence-calculating unit configured to determine the measuring sequence on the basis of control parameters,
wherein the measuring-sequence-determining device is configured such that, during the determination of the measuring sequence in a gradient-optimization method, the measuring-sequence-determining device automatically optimizes gradient-pulse parameters of the measuring sequence to reduce at least one gradient-pulse-parameter maximum value, and wherein, as a boundary condition in the gradient-optimization method, the intra-repetition-interval time parameter is kept constant at least within a specified tolerance value.

16. A magnetic resonance system comprising:
a high-frequency transmission system comprising:
   a gradient system; and
   a control device configured to control the high-frequency transmission system and the gradient system in order to carry out a desired measurement based on a specified measuring sequence; and
a measuring-sequence-determining device for determining a measuring sequence for the magnetic resonance system, the measuring-sequence-determining device comprising:
   an input interface operable to acquire at least one intra-repetition-interval time parameter; and
   a measuring-sequence-calculating unit configured to determine the measuring sequence on the basis of control parameters,
wherein the measuring-sequence-determining device is configured such that, during the determination of the measuring sequence in a gradient-optimization method, the measuring-sequence-determining device automatically optimizes gradient-pulse parameters of the measuring sequence to reduce at least one gradient-pulse-parameter maximum value,
wherein, as a boundary condition in the gradient-optimization method, the intra-repetition-interval time parameter is kept constant at least within a specified tolerance value, and
wherein the measuring-sequence-determining device is operable to forward the measuring sequence to the control device.

17. A computer program product loadable directly into a non-transitory computer-readable medium of a measuring-sequence-determining device, the computer program product including instructions executable by the measuring-sequence-determining device to determine a measuring sequence for a magnetic resonance system, the instructions comprising:
automatically optimizing, during the determination of the measuring sequence in a gradient-optimization method, gradient-pulse parameters of the measuring sequence in order to reduce at least one gradient-pulse-parameter maximum value,
wherein, as a boundary condition in the gradient-optimization method, an intra-repetition-interval time parameter is kept constant at least within a specified tolerance value.

18. The computer program product as claimed in claim 17, wherein the gradient-pulse parameters comprise a slew rate, a gradient amplitude of a gradient pulse of the measuring sequence, or the slew rate and the gradient amplitude.

19. The computer program product as claimed in claim 17, wherein the measuring sequence comprises an echo sequence, and the intra-repetition-interval time parameter comprises an echo time.

20. The computer program product as claimed in claim 17, wherein the instructions further comprise optimizing, in the gradient-optimization method, the at least one gradient-pulse-parameter maximum value.

* * * * *